(12) United States Patent
Van Der Smissen et al.

(10) Patent No.: US 11,761,808 B2
(45) Date of Patent: Sep. 19, 2023

(54) SENSOR DEVICE FOR DETECTING ELECTRICALLY CONDUCTIVE MEDIA, AND METHOD FOR OPERATING THE SENSOR DEVICE

(71) Applicant: Robert Bosch GmbH, Stuttgart (DE)

(72) Inventors: Christoph Van Der Smissen, Holzgerlingen (DE); Stefan Kottmann, Waldstetten (DE); Stefan Walz, Schwaebisch Gmuend (DE); Frederik Morlok, Wildberg (DE); Nestor Mbogni, Sindelfingen (DE); Michael Johannes Franz, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 237 days.

(21) Appl. No.: 16/772,691

(22) PCT Filed: Dec. 7, 2018

(86) PCT No.: PCT/EP2018/083909
§ 371 (c)(1),
(2) Date: Jun. 12, 2020

(87) PCT Pub. No.: WO2019/115369
PCT Pub. Date: Jun. 20, 2019

(65) Prior Publication Data
US 2020/0300684 A1    Sep. 24, 2020

(30) Foreign Application Priority Data
Dec. 15, 2017    (DE) ..................... 10 2017 222 845.8

(51) Int. Cl.
*G01F 23/263*    (2022.01)
*G01F 23/00*    (2022.01)
*G01R 19/00*    (2006.01)

(52) U.S. Cl.
CPC .......... *G01F 23/265* (2013.01); *G01F 23/266* (2013.01); *G01F 23/00* (2013.01); *G01R 19/0084* (2013.01)

(58) Field of Classification Search
CPC ...... G01F 23/265; G01F 23/266; G01F 23/00; G01R 19/0084; G01N 27/048; G01N 27/028
See application file for complete search history.

(56) References Cited

U.S. PATENT DOCUMENTS 6,293,145 B1 * 9/2001 Wallrafen ............. G01F 23/266
                                                         73/304 C
7,634,945 B2 * 12/2009 Champion ............ G01F 23/284
                                                         73/306
(Continued)

FOREIGN PATENT DOCUMENTS

CN    201839354 U  *  5/2011  ............. H04N 1/028
CN    102449442 A     5/2012
(Continued)

OTHER PUBLICATIONS

International Search Report corresponding to PCT Application No. PCT/EP2018/083909, dated Mar. 28, 2019 (German and English language document) (5 pages).
(Continued)

*Primary Examiner* — Alexander Satanovsky
*Assistant Examiner* — Asm Fakhruddin
(74) *Attorney, Agent, or Firm* — Maginot, Moore & Beck LLP

(57) ABSTRACT

A sensor device for detecting liquid, in particular in a controller of a steering system of a vehicle, includes at least one sensor element and a testing unit. The sensor element is electrically connected to the testing unit. The testing unit has a signal transmitter, connected to the sensor element, that is configured to generate an electrical test signal, and a signal
(Continued)

receiver, connected to the sensor element, that is configured to detect a reaction signal for the electrical test signal. The signal transmitter and the signal receiver are each connected at high impedance to the at least one sensor element. The testing unit is configured to detect the reaction signal at least at a time as a first reaction signal for which the electrical test signal has been generated in order to infer a presence of the medium.

12 Claims, 7 Drawing Sheets

(56) References Cited

U.S. PATENT DOCUMENTS

| | | | |
|---|---|---|---|
| 2006/0061368 A1 | 3/2006 | Furse et al. | |
| 2008/0225395 A1* | 9/2008 | Veerasamy | H05K 1/0274 340/602 |
| 2010/0033883 A1 | 2/2010 | Simon | |
| 2016/0181885 A1* | 6/2016 | Yamasaki | H02K 5/10 180/443 |
| 2017/0127196 A1* | 5/2017 | Blum | H04R 25/554 |

FOREIGN PATENT DOCUMENTS

| | | | | |
|---|---|---|---|---|
| CN | 103529092 A | | 1/2014 | |
| CN | 204705388 U | * | 10/2015 | |
| CN | 105652095 A | | 6/2016 | |
| DE | 42 16 176 A1 | | 11/1993 | |
| DE | 10 2006 051 799 A1 | | 5/2008 | |
| DE | 102006051799 A1 | * | 5/2008 | ............... B62D 5/04 |
| GB | 1 391 251 | | 4/1975 | |
| GB | 2 004 071 A | | 3/1979 | |
| JP | S63-75651 A | | 4/1988 | |
| JP | H5-62852 U | | 8/1993 | |
| JP | 2006-111032 A | | 4/2006 | |
| JP | 5133926 B2 | | 1/2013 | |
| JP | 5383891 B1 | | 10/2013 | |
| JP | 2014-29315 A | | 2/2014 | |
| JP | 2014029315 A | * | 2/2014 | ............. G01N 27/22 |

OTHER PUBLICATIONS

Duff, W., "Designing Electronic Systems for EMC," Chinese-Language Version, 2013, p. 70, National Defence Industry Press, China.

* cited by examiner

SENSOR DEVICE FOR DETECTING ELECTRICALLY CONDUCTIVE MEDIA, AND METHOD FOR OPERATING THE SENSOR DEVICE

This application is a 35 U.S.C. § 371 National Stage Application of PCT/EP2018/083909, filed on Dec. 7, 2018, which claims the benefit of priority to Serial No. DE 10 2017 222 845.8, filed on Dec. 15, 2017 in Germany, the disclosures of which are incorporated herein by reference in their entirety.

The disclosure relates to a sensor device for detecting electrically conductive medium, in particular liquid, in particular in a control unit of a steering system of a vehicle, having a testing unit and having at least one sensor element, which is electrically connected to the testing unit.

Furthermore, the disclosure relates to a control unit, a steering system, and a method for operating such a sensor device.

BACKGROUND

Sensor devices and methods for operating them are already known from the prior art. To detect water, detecting, by means of two electrically conductive sensor elements, whether they are brought into an electrical connection by the water is known. If the two sensor elements are overrun by the water, for example, and one of the sensor elements is set to a predetermined electrical potential, it can thus be detected at the other sensor element whether it assumes the electrical potential of the other sensor element. In order that the sensor elements experience reduced oxidation and/or migration, the measurement is typically time limited, contact materials are replaced by noble metals, or an AC voltage is applied to the sensor elements. Thus, for example, an AC voltage is generated by alternately switching over the contacts as sensor input and as sensor output. If the known potential at the respective other contact is detected here, this is thus evaluated as water contact. A further known method provides connecting a first sensor element to ground and applying an AC voltage to a second sensor element at high resistance. As soon as the absence of the AC voltage signal is detected, this is evaluated as water contact.

Analyzing the capacitance at the sensor elements to exclude oxidation of the sensor elements is also known. This is typically performed by applying a usually oscillating AC voltage, the frequency of which changes and is thus used as a detection criterion. A detection can also be performed by applying signal pulses, in that a charge curve is analyzed. A detection of distilled water, i.e., water which is actually not electrically conductive, is thus also possible since the conductance is not decisive here, but rather the dielectric constant of the water.

The known measurement methods have the disadvantage that the measurement environment has to be free of interference sources and/or electrical interference fields, external potentials, and other environmental influences to enable an unambiguous analysis.

SUMMARY

The sensor device according to the disclosure has the advantage that interference-insensitive recognition and/or detection of conductive medium is enabled, i.e., even in environments having electromagnetic interference fields or the like. Moreover, a potential-independent detection of the media is ensured, which requires a low energy expenditure and also a low expenditure for device technology. In particular, the sensor device, in particular the testing unit, is implementable cost-effectively in a microcontroller or an application-specific integrated circuit (ASIC). It is provided for this purpose according to the disclosure that the testing unit comprises a signal generator which is connected to the at least one sensor element and which is designed to generate an electrical test signal, in particular a test pulse, and also a signal receiver which is connected to the sensor element and which is designed to detect a reaction signal generated or caused by the test signal, wherein the signal generator and the signal receiver are each connected with high resistance, in particular by a resistor in each case, to the at least one sensor element, and wherein the testing unit is designed to detect the reaction signal by means of the signal receiver as a first reaction signal at least at a point in time at which the test signal is generated, in order to conclude a presence of the medium, in particular liquid. The testing unit is thus designed to detect a first reaction signal at a point in time which is distinguished in that the test signal is already generated and therefore a reaction signal corresponding to the test signal would have to be able to be detected by the signal receiver. The point in time at which the test signal is generated is thus to be understood as the point in time at which the actual value of the test signal corresponds to a predetermined target value. In particular, the test signal is a test pulse, in particular in the form of a voltage pulse. In a first phase of the pulse generation, the voltage firstly increases until its actual value reaches the desired target value. This is the point in time at which the testing unit detects the first reaction signal, i.e., at a point in time at which the test signal has reached the desired value. Subsequently, when the test pulse or the test signal is ended, the voltage value decreases again. Because of the advantageous construction of the sensor device, an unambiguous statement about the presence or absence of a conductive medium is thus already possible, because the analysis of the first reaction signal results in an unambiguous result. The high-resistance application of signal receiver and signal generator to the at least one sensor element is preferably achieved by electrical resistors. Thus, in particular a first resistor is connected between the signal generator and the sensor element and a second resistor is connected between the signal receiver and the sensor element. In the signal propagation direction, the first resistor is thus connected downstream from the signal generator and the second resistor is connected upstream from the signal receiver. In particular, the sensor device comprises multiple sensor elements, which are each connected with high resistance to the signal receiver and the signal generator. In this case, preferably only one first resistor and only one second resistor are provided, which are both connected to the multiple sensor elements.

Furthermore, it is preferably provided that the at least one sensor element or, if multiple sensor elements are provided, the respective sensor element is connected to a positive or to a negative electric voltage potential, in order to ensure an unambiguous assignment of the sensor element, so that the detected reaction signal is analyzable unambiguously and behaves as expected upon the presence and/or absence of electrically conductive medium.

According to one preferred refinement of the disclosure, it is provided that the sensor device, in particular the at least one or the respective sensor element, is connected to a so-called floating ground, which is formed in particular with the aid of an electrical resistor and/or a capacitor. The potential independence of the sensor device is thus supplemented by a further application.

It is preferably provided that the at least one or the respective sensor element is connected by a capacitor in each case to an external ground or to a ground terminal of the sensor device. An interference source subject to ESD is thus decoupled from the sensor device and therefore does not influence the measurement result when detecting the reaction signal.

Furthermore, it is preferably provided that multiple sensor elements are each connected by a capacitor to ground or the external ground, wherein the capacitors in particular have different capacitances. If the sensor device thus comprises multiple sensor elements, they are thus each connected by an associated capacitor to a ground terminal, so that an interference source subject to ESD is reliably decoupled for each sensor element. The capacitors preferably have different capacitances with the result that the detected reaction signal behaves differently in dependence on which of the sensor elements is in contact with electrically conductive medium, and it can thus be established by the testing unit which of the sensor elements has come into contact with the medium. Unambiguous diagnosis is thus ensured even with multiple sensor elements.

Furthermore, it is preferably provided that a capacitor is connected to ground between the second resistor and the signal receiver. High-frequency interference sources/interference fields are short-circuited by the capacitor in this way and thus decoupled for the analysis of the test signal. This capacitor can be formed as an additional component or as a parasitic capacitor present due to the measuring device.

Furthermore, it is preferably provided that a third resistor is connected to ground between the first resistor and the signal generator. The third, in particular high-resistance resistor is connected directly at the signal generator or its logic output to ground to dissipate possible cross currents. If a logical zero is written out by the signal generator, the resulting cross currents are thus dissipated to the circuit ground or the external ground by the third resistor.

According to one preferred embodiment of the disclosure, it is provided that the first resistor and the second resistor are connected to the at least one sensor element by a shared signal line. A simple circuit construction is thus ensured and reliable reading back of the reaction signal by the signal receiver is ensured. In particular, the first resistor and/or the second resistor are connected by the shared signal line directly to the first sensor element, i.e., without interconnecting a further electrical/electronic component, such as a capacitor in particular.

The testing unit is designed in particular to detect a second reaction signal at a point in time before the test signal is generated, to detect the first reaction signal at the point in time at which the test signal is generated, and to detect a third reaction signal at a point in time after the test signal is completed. In addition to the point in time already mentioned at the outset for the detection of the first reaction signal, which is selected so that the test signal is already generated and thus acts on the sensor element, it is thus provided in this case that a reaction signal is additionally detected even before generating the test signal and after completing the test signal. A reaction signal is thus measured and/or read back with high resistance at the three signal points in time, in particular only then, and in particular evaluated differently at each of these points in time. From consideration of the three detected reaction signals and/or the reaction signal at the three mentioned points in time together, it is differentiable whether the one sensor element is faulty or functional, and whether the sensor element is in contact with the electrically conductive medium or not.

According to a further embodiment of the disclosure, it is provided that a capacitor is arranged in the shared signal line and/or is interconnected between the first and the second resistor, on the one hand, and the sensor elements, on the other hand. By way of the additional capacitor, an RC element is formed in the sensor device, which permits the measurement of the reaction signal to be reduced to a single point in time and nonetheless an unambiguous measurement result to be obtained. In particular, the testing unit is designed here to detect only the first reaction signal at the point in time at which the test pulse is generated. While in the above-described embodiment a DC voltage-coupled system is proposed, this embodiment provides an AC voltage-coupled system. It is also possible here to carry out the detection of the conductive medium independently of potential. This is achieved in that the high-resistance signal input of the testing unit and/or the signal receiver is decoupled toward the sensor elements using the second resistor connected upstream via the capacitor connected in series.

Furthermore, it is preferably provided that the testing unit is designed to generate different test signals, for example, test pulses having different voltage levels or different pulse lengths, in dependence on a desired sensor sensitivity. The testing unit is adaptable to environmental conditions and/or applications in this way. It is also possible to change a resistance measurement range of the measurement voltage by a variation of the pulse length and/or width, for example, to differentiate between condensation (ion-poor), penetrating water (ion-rich), and saltwater (salt ions). If a capacitor is associated with each of the sensor elements, as described above, by which the sensor element is connected to ground or external ground, an absence or a malfunction of one of the sensor elements can thus additionally be recognized by variation of the charging time of the connected sensors. In addition, the sensor device is capable by way of an overlong test pulse of diagnosing itself and recognizing whether the electrical resistors are provided in the measurement circuit, in particular the first, the second, and the third resistor. It can additionally be recognized by a very short test pulse whether the decoupling capacitor is provided in the shared signal line. In addition, by way of the variation of the test signal, incorrect measurements caused by interference pulses can be checked for plausibility by repeated query and evaluation of the reaction signal.

The control unit according to the disclosure is distinguished by the sensor device according to the disclosure. It is thus possible to detect liquid in or on the control unit reliably and simply. In particular, at least one of the sensor elements of the sensor device is arranged in the interior of a housing of the control unit to monitor the penetration of water into the control unit.

The steering system according to the disclosure is distinguished by at least one sensor device according to the disclosure. The above-mentioned advantages thus result. In particular, the sensor device is associated with a control unit of the steering system, for example, to detect water penetrating into the control unit, wherein for this purpose in particular at least one of the sensor elements is arranged in the interior of the housing of the control unit. The sensor device or a further sensor device can also be associated with a steering gear housing or an actuator of the steering system to monitor it for penetrating water or water in the environment. The control unit and/or the steering system preferably comprise multiple sensor devices according to the disclosure, which are formed as a level measuring device and/or are interconnected.

The method according to the disclosure for operating the sensor device and/or the steering system is distinguished in that the signal generator is activated to generate a test signal, in particular a test pulse, and wherein a first reaction signal is detected by means of the signal receiver at least at a point in time at which the test signal is generated, and wherein the functionality and/or the presence of the electrically conductive medium, in particular liquid, is determined by the at least one sensor element in dependence on the detected reaction signal. In particular, in dependence on the reaction time of the detected reaction signal, the absence of a sensor is ascertained, wherein in this case a capacitor is preferably associated with the sensor, by which the sensor is connected to a circuit ground or an external ground. The reaction signal is particularly preferably detected at three points in time, namely at a first point in time, at which the test signal is not yet generated, at a second point in time, at which the test signal is generated, and at a third point in time, at which the test signal is completed, so that in total three reaction signals are detected. The functionality of the at least one sensor element and the presence of the electrically conductive medium are determined in dependence on the signal values at the three points in time.

BRIEF DESCRIPTION OF THE DRAWINGS

The disclosure will be explained in greater detail hereafter on the basis of the drawing. In the figures.

DETAILED DESCRIPTION

Figure 1:
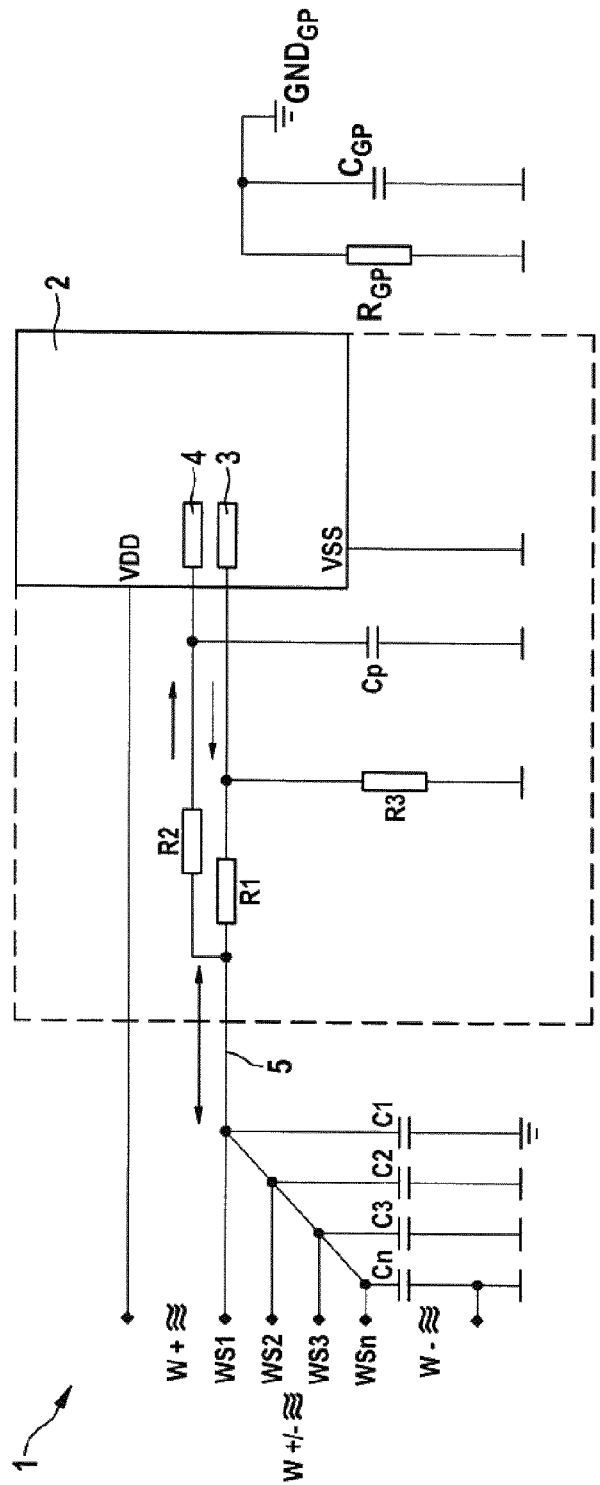
FIG. 1 shows an advantageous sensor device for detecting an electrically conductive medium according to a first exemplary embodiment.

FIG. 1 shows a simplified illustration of a sensor device 1 for detecting electrically conductive media, in particular an electrically conductive liquid, in a control unit 6 (not shown in greater detail here) of a steering system of a motor vehicle.

The sensor device 1 comprises multiple sensor elements WS1, WS2, WS3 to WSn, which are electrically connected to a testing unit 2. The sensor elements WS1 to WSn are, for example, electrically conductive testing contacts. The testing unit 2 preferably comprises a microcontroller or an ASIC circuit (application-specific integrated circuit) or is formed thereby. The testing unit 2 comprises a signal generator 3, which is designed to generate an electrical test signal and optionally vary it. In addition, the testing unit 2 comprises a signal receiver 4, which is designed to detect at least one electrical reaction signal in the sensor device 1, which results from the test signal generated by the signal generator 3. The testing unit 2 is designed to determine in dependence on the detected reaction signal whether the sensor device 1 is functional and/or whether electrically conductive medium is detected by one or more of the sensor elements WS1 to WSn. For this purpose, the signal generator 3 and the signal receiver 4 are connected by a shared signal line 5 to the sensor elements WS1 to WSn. Before the signal lines 5 are unified, a first resistor R1 is connected downstream from the signal generator 3 and a second electrical resistor R2 is connected upstream from the signal receiver 4. The resistors R1 and R2 are formed to be high-resistance, so that the respective test signal is output by the signal generator 3 at high resistance to the sensor elements WS1 to WSn and is read back at high resistance by the signal receiver 4.

Each of the sensor elements WS1 to WSn is connected, on the one hand, to the shared signal line 5 and, on the other hand, is connected by a capacitor C1 to Cn to ground of the sensor device 1 or to an external ground, so that interferences and/or interference sources which originate from electrostatic discharges are decoupled to ground.

The signal receiver 4 is additionally connected via a further capacitor Cp to ground, so that high-frequency interference sources are short-circuited at the sensor input and thus decoupled. The capacitor Cp can be formed as an additional component or, however, by the parasitic capacitor present due to the logic input of the signal receiver 4.

Furthermore, a high-resistance resistor R3 for dissipating possible cross currents is connected to ground directly at the logic output and/or at the output of the signal generator 3. If a logical zero is written out by the signal generator 3, the cross currents thus resulting are dissipated thereby to ground. Signal generator 3 and signal receiver 4 are formed in particular as digital components to enable a simple testing method.

Figure 4A:
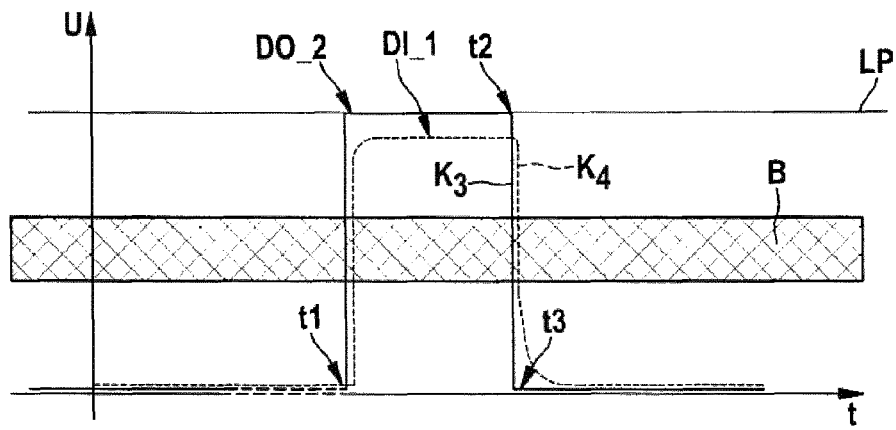
FIGS. 4A to 4F show exemplary characteristic curves of the sensor device in dependence on different applications.

FIG. 4A shows characteristic curves of the sensor device 1 in the test mode in a simplified diagram. A first solid characteristic curve $K_3$ shows the test signal generated by the signal generator 3 over the time t. A dashed line $K_4$ shows the reaction signal received by the signal receiver 4 from the circuit or the signal line 5. A line Lp indicates the logic level to be reached for the test signal $K_3$. A shaded region B marks an undefined level or a hysteresis level, within which the reading back of the reaction signal $K_4$ would not result in an unambiguous result.

At a point in time t1, a water query is started in that the signal generator 3 generates the test signal $K_3$ in the form of a test pulse. The reaction signal $K_4$ results in reaction thereto if none of the sensors WS1 to WSn is in contact with electrically conductive medium. The reaction signal $K_4$ nearly reaches the level of the test signal $K_3$ at a point in time t2, at which the test signal $K_3$ is reliably generated, in particular shortly before the test signal or the test pulse is ended at a point in time t3 and thus terminated.

The moisture query is thus performed by emitting and querying the test signal. The signal generator is initially permanently set to "low". Even before it generates the test signal, it or the test signal is read out at high resistance by the signal receiver 4. If a low level is detected, water can thus be present. However, since a "low" is expected at this point in time, this is evaluated as the absence of water. However, if the input level is at "high", an external potential W+, for example, the electrically conductive water which is connected to a positive potential, is thus present. This state is then detected or evaluated at this point in time t1 as "water present".

At a second point in time t2, the reaction signal is also read out by the signal receiver 4, even before the test signal is switched off again or the high level of the test signal is switched to the low level. If a high level is read at this point in time t2, this is thus evaluated as "no water". However, if the reaction signal is at "low", this is thus evaluated at this point in time t2 as "water present", wherein the external potential of the water is a negative here.

Subsequently, at the point in time t3, a low level is again written or output with high resistance by the signal generator by terminating the test signal. A readout by means of the signal receiver 4 is again performed at the point in time t3. If a low level (water could be present) is now read, this is thus evaluated as an "absence of water". However, if the reaction signal is "high", "water present" is thus detected. A positive external potential of the water (W+) is then applied. This last writing and reading procedure forces the logic to also perform a hysteresis jump, wherein both a positive external potential and also negative external potential are present. Without this jump, a discovery gap could result. However, this case occurs very rarely. The hysteresis jump can be defined by lengthening and shortening the test signal.

The presence of liquid is thus ascertainable reliably independently of potential by the measurement and/or readout of the three reaction signals or the reaction signal at the three predetermined points in time t1 (before the test signal is generated), t2 (when the test signal is generated), and t3 (when the test signal is completed).

Figure 2:
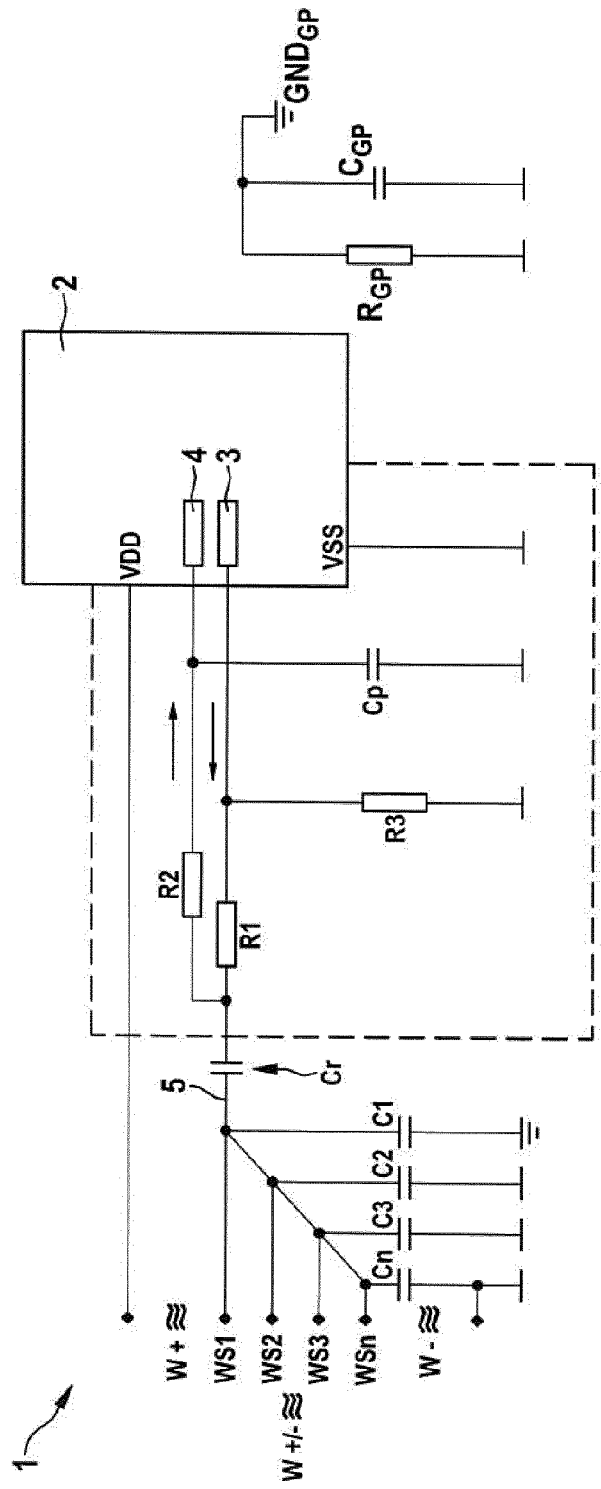
FIG. 2 shows the advantageous sensor device according to a second exemplary embodiment.

FIG. 2 shows a second exemplary embodiment of the sensor device 1, wherein elements already known from FIG. 1 are provided with the same reference signs and reference is thus made to the above description. Essentially the differences will be discussed hereafter.

In contrast to the first exemplary embodiment, the sensor device according to the second exemplary embodiment provides that, in the shared signal line 5, a capacitor Cr is connected in series with the sensor elements WS1 to WSn and the signal generator 3 and/or the signal receiver 4 in a DC voltage manner. An RC element is thus formed, with the advantage that a decoupled system results, in which the measurement points in time t1 and t3 are no longer relevant, only the point in time t2 is still important. It is presumed that each voltage source acts like a capacitor, so that at the measurement pulse moment, it goes toward 0 ohm. It is therefore unimportant whether the measurement is performed toward a negative or a positive potential (for example, ground or positive potential), because the measurement pulse moment at the point in time t2, when the test signal is generated, is only considered to be the short circuit to ground or to the negative potential, respectively. By adding the capacitor Cr, an even simpler and nonetheless unambiguous determination of the moisture or an electrically conductive medium at one of the sensor elements WS1 to WSn is thus enabled.

While the resistors R1, R2, R3 and the capacitor Cp are located outside the testing unit 2 in FIGS. 1 and 2, it is provided according to a further exemplary embodiment that they are also formed by the testing unit 2 or located therein. This is shown in FIGS. 1 and 2 by a dashed frame.

Figure 3:
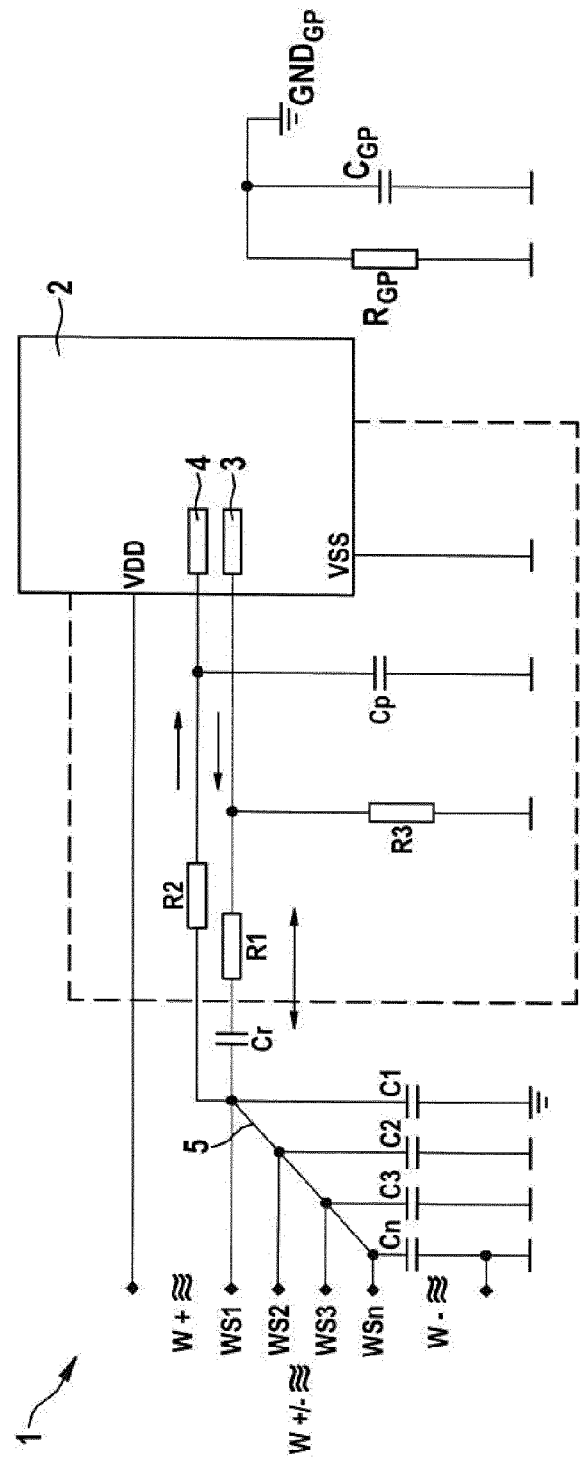
FIG. 3 shows the sensor device according to a third exemplary embodiment.

FIG. 3 shows a further exemplary embodiment of the sensor device 1, which differs from the preceding exemplary embodiments in that the capacitor Cr is connected downstream from the resistor R1 or the high-resistance output of the signal generator 3 even before the shared signal line 5. This is thus a combination of the first two exemplary embodiments. An advantageous measurement is also reliably ensured here.

FIGS. 4A to 4F show different measurement cycles, which can be carried out using the advantageous sensor device 1. FIG. 4A was already explained above, wherein the same reference signs are used in FIGS. 4B to 4F and reference is thus made to the above description.

A measurement cycle is carried out without potential in the exemplary embodiment of FIG. 4A, wherein water is not detected at any of the sensor elements WS1 to WSn.

Figure 4B:
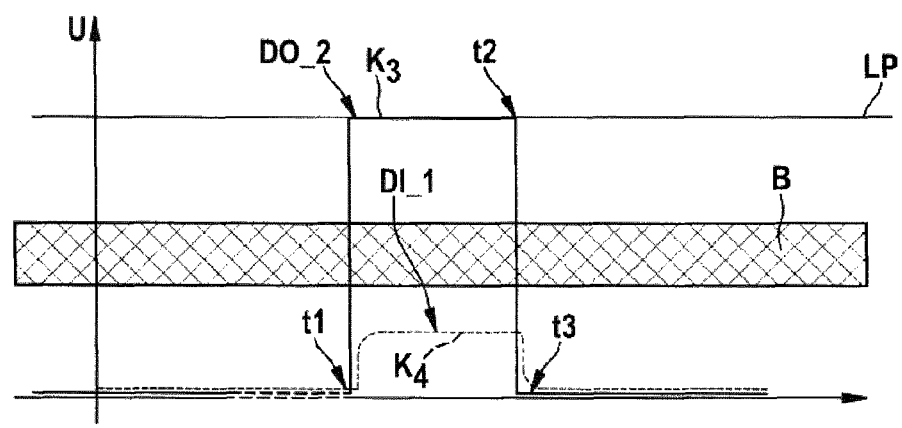

The exemplary embodiment of FIG. 4B involves a state in which at least one of the sensor elements WS1 to WSn is in contact with water or electrically conductive liquid. The reaction signal $K_4$ unambiguously differs from the test signal $K_3$ and does not reach the high level.

Figure 4C:
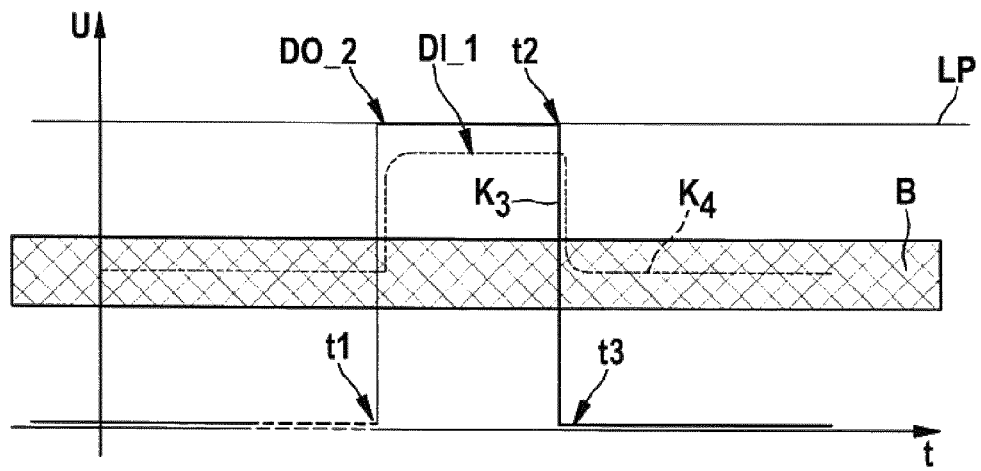

FIG. 4C shows a measurement cycle with water present and with a mixed potential of supply voltage and ground. An elevated high reaction signal results at the point in time t2, however, outside this region, the reaction signal $K_4$ is in the undefined level range B.

Figure 4D:
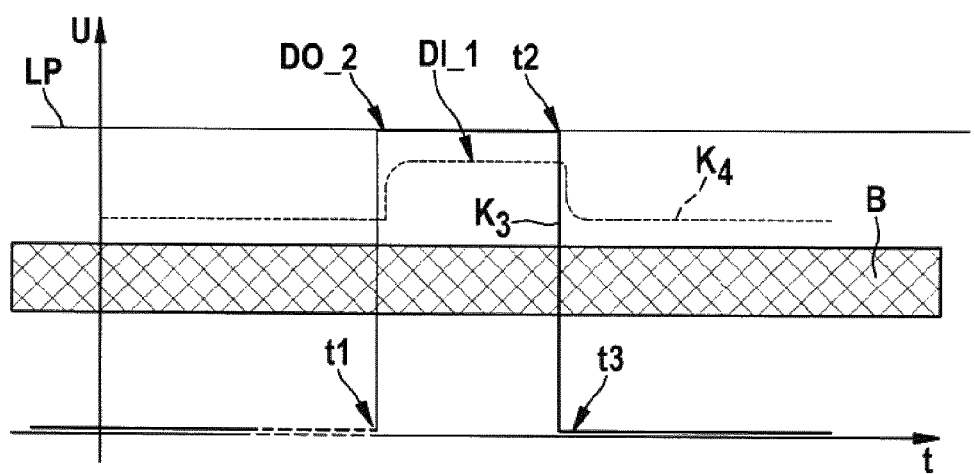

In the case of a measurement with water present in relation to a supply voltage, a measurement cycle results as shown in FIG. 4D.

Figure 4E:
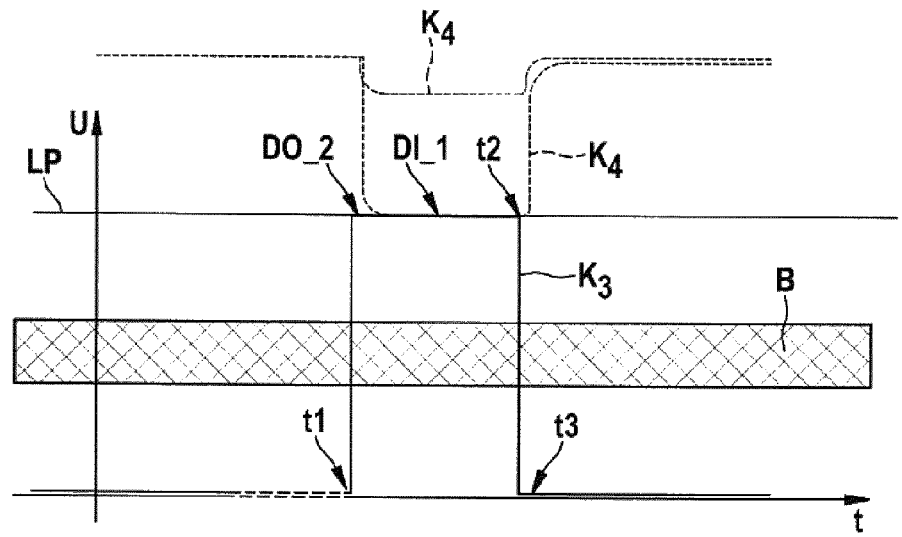
Figure 4F:
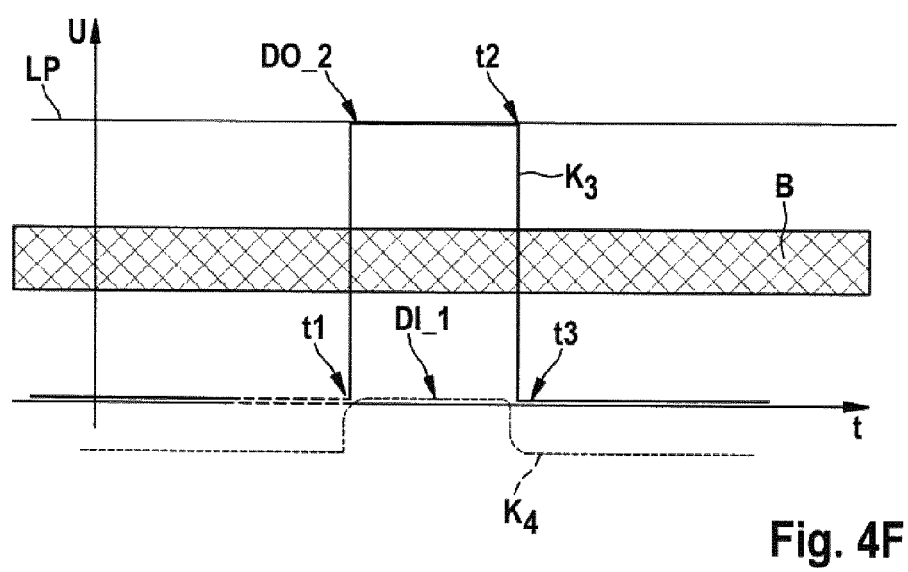

FIG. 4E shows a measurement cycle with water present in relation to an elevated positive potential and FIG. 4F shows a measurement cycle with water present in relation to an elevated negative potential.

It has been shown that the sensor device 1 in its different designs is always capable of unambiguously recognizing the presence of water or another electrically conductive liquid independently of potential.

Figure 5:
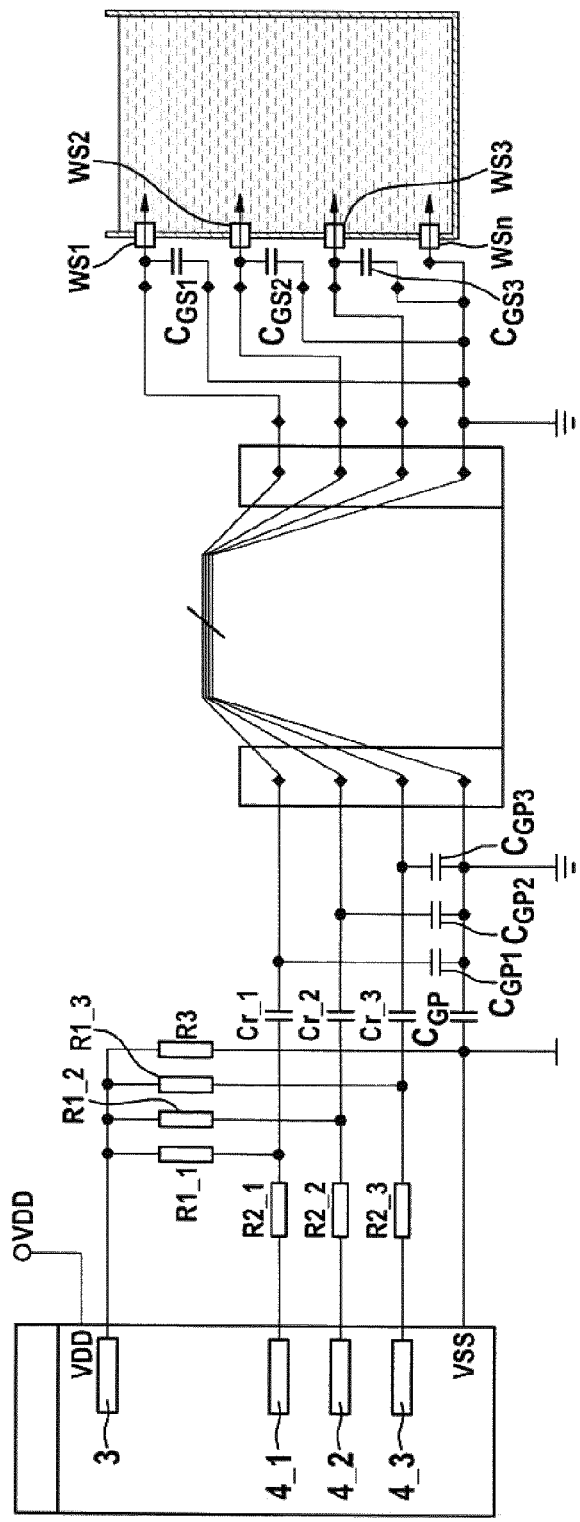
FIG. 5 shows a level measuring device which comprises a plurality of the advantageous sensor devices.

FIG. 5 shows a further exemplary embodiment, in which a plurality of the sensor devices 1 are combined to form a level measuring device, wherein known elements are provided with the same reference signs and reference is thus made to the above description. It has been shown that the interconnection of multiple such sensor devices 1 results in an advantageous level measuring device, by means of which a fill level, for example, in a water tank or fuel tank, is ascertainable unambiguously.

The resistance measuring range of the measurement voltage can be changed by a variation of the test signal or its pulse width, so that, for example, it is possible to differentiate between condensation (ion-poor), penetrating water (ion-rich), and saltwater (salt ions). The wider the test pulse is, the higher is the measurement pulse voltage and thus the more insensitive the measuring system, and vice versa. In addition, by determining the charging time of the connected sensor elements WS1 to WSn, an absence of one of the sensor elements WS1 to WSn is recognizable, because each sensor element WS1 to WSn receives a separate ESD capacitor C1 to Cn. The capacitors C1 to Cn advantageously have different capacitances to enable an unambiguous assignment. In addition, the sensor device 1 itself can be diagnosed by an overlong test pulse, for example, by recognizing whether the resistors R1, R2, and possibly R3 are present. In contrast, it is recognizable by a very short test pulse whether the decoupling capacitor Cr is present in the sensor device 1 according to the second or the third exemplary embodiment.

The circuit can monitor itself for its functionality by way of the above-mentioned variation of the test pulses. In addition, it is possible by way of the variation of the test pulses and/or the test signal, by repeated query and evaluation, to check for plausibility incorrect measurements caused by interference pulses (periodic or random).

The respective sensor device 1 additionally preferably operates using so-called floating grounds ($GND_{GP}$), as shown by way of example in FIGS. 1 to 3, which expands the potential independence thereof by an additional function. The floating ground $GND_{GP}$ is formed in particular with the aid of a resistor $R_{SP}$ and/or a capacitor $C_{GP}$.

An interference-insensitive water detection of ionized or contaminated water at a processor/ASIC/logic input (signal receiver 4) is possible by way of the sensor device 1. This insensitivity to interference relates both to electrostatic discharges and also to electromagnetic interference fields or external voltage potentials. Positive, negative, and also mixed potentials can be used for water detection. The applied resistance is ascertained independent of potential. This is achieved by the triple signal analysis in the case of the first exemplary embodiment, which is evaluated differently at each signal point in time.

The detection of the water or the medium is performed in this case with low energy by the sensor device 1, since energy in the microwatt range is only required at the measurement point in time. In the case of an external solution, i.e., not integrated in an ASIC or microcontroller, only two contact terminals are necessary, one for outputting the test signal and one for inputting the reaction signal, two high-resistance resistors R1, R2 and also the ESD capacitors C1 to Cn and optionally the decoupling capacitor Cr.

Since the circuit of the sensor device 1 essentially consists of the resistors R1, R2, and R3, it can also be integrated into the microcontroller or into the ASIC, as already explained above. A specialized water sensor input thus results, which is both a high-resistance read input and also a high-resistance write output.

The sensor device 1 additionally has the advantage that the electrodes or the sensor elements WS1 to WSn are substantially freed of corrosion or migration due to the pulse method by the test pulses, so that the long-term durability of the sensor device 1 is ensured.

The invention claimed is:

1. A sensor device for detecting at least one electrically conductive medium in a control unit, comprising:
   a plurality of sensor elements;
   a plurality of capacitors;
   a testing unit; and
   a shared signal line configured to electrically connect the plurality of sensor elements and the plurality of capacitors to the testing unit,
   wherein the testing unit comprises (i) a signal generator connected to the plurality of sensor elements by the shared signal line and configured to generate an electrical test signal on the shared signal line, and (ii) a signal receiver connected to the plurality of sensor elements by the shared signal line and configured to detect a first reaction signal to the electrical test signal on the shared signal line,
   wherein the testing unit is configured to analyze the first reaction signal at a first point in time to conclude a presence or absence of the medium,
   wherein the first point in time is when the electrical test signal is generated and when the electrical test signal has reached a predetermined value,
   wherein the shared signal line is connected directly (i) to each sensor element of the plurality of sensor elements, and (ii) to each capacitor of the plurality of capacitors, and
   wherein each capacitor of the plurality of capacitors is connected directly to ground.

2. The sensor device as claimed in claim 1, wherein each sensor element of the plurality of sensor elements is connected to a positive or to a negative electrical voltage potential.

3. The sensor device as claimed in claim 1, wherein the sensor device is connected to a floating ground.

4. The sensor device as claimed in claim 1, wherein the capacitors of the plurality of capacitors each have different capacitances.

5. The sensor device as claimed in claim 1, further comprising:
   a further capacitor, the further capacitor connected to ground between a second resistor and the signal receiver.

6. The sensor device as claimed in claim 5, wherein a third resistor is connected to ground between a first resistor and the signal generator.

7. The sensor device as claimed in claim 6, wherein the first resistor and the second resistor are connected directly to the at least one sensor element by the shared signal line.

8. The sensor device as claimed in claim 1, wherein:
   the testing unit is configured to analyze a second reaction signal at a second point in time,
   the second point in time is before the electrical test signal is generated and before the first point in time,
   the testing unit is configured to analyze a third reaction signal at a third point in time, and
   the third point in time is after the electrical test signal is completed and after the second point in time.

9. The sensor device as claimed in claim 6, further comprising:
   a further capacitor arranged serially in the shared signal line, and
   wherein first resistor and the second resistor are connected directly to the further capacitor.

10. The sensor device as claimed in claim 1, wherein the sensor device is included in a control unit.

11. A steering system comprising:
    at least one control unit including at least one sensor device configured to detect at least one electrically conductive medium in the at least one control unit, the at least one sensor device including a plurality of sensor elements, a testing unit, and a plurality of capacitors,
    wherein a shared signal line is configured to electrically connect the plurality of sensor elements and the plurality of capacitors to the testing unit,
    wherein the testing unit comprises (i) a signal generator connected to the plurality of sensor elements by the shared signal line and configured to generate an electrical test signal on the shared signal line, and (ii) a signal receiver connected to the plurality of sensor elements by the shared signal line and configured to detect a first reaction signal to the electrical test signal on the shared signal line,
    wherein the testing unit is configured to analyze the first reaction signal at a first point in time to conclude a presence or absence of the medium,
    wherein the first point in time is when the electrical test signal is generated and when the electrical test signal has reached a predetermined value,
    wherein the shared signal line is connected directly (i) to each sensor element of the plurality of sensor elements, and (ii) to each capacitor of the plurality of capacitors, and
    wherein each capacitor of the plurality of capacitors is connected directly to ground.

12. The sensor device as claimed in claim 1, wherein:
    the medium is a liquid, and
    the sensor device and the control unit are included in a steering system of a vehicle.

* * * * *